(12) United States Patent
Inoue et al.

(10) Patent No.: US 11,694,868 B2
(45) Date of Patent: Jul. 4, 2023

(54) MULTI-BEAM IMAGE ACQUISITION APPARATUS AND MULTI-BEAM IMAGE ACQUISITION METHOD

(71) Applicant: NuFlare Technology, Inc., Yokohama (JP)

(72) Inventors: Kazuhiko Inoue, Yokohama (JP); Munehiro Ogasawara, Hiratsuka (JP); Atsushi Ando, Edogawa-ku (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/646,883

(22) Filed: Jan. 4, 2022

(65) Prior Publication Data

US 2022/0230837 A1    Jul. 21, 2022

(30) Foreign Application Priority Data

Jan. 21, 2021 (JP) .................. 2021-008258

(51) Int. Cl.
*H01J 37/145* (2006.01)
*H01J 37/285* (2006.01)
*H01J 37/28* (2006.01)

(52) U.S. Cl.
CPC .......... *H01J 37/145* (2013.01); *H01J 37/285* (2013.01); *H01J 37/28* (2013.01)

(58) Field of Classification Search
CPC .... H01J 37/3177; H01J 37/145; H01J 37/147; H01J 37/28; H01J 37/285; H01J 2237/31774
See application file for complete search history.

(56) References Cited

U.S. PATENT DOCUMENTS 6,509,569 B1 *   1/2003 Frosien ................. H01J 37/147
                                                              850/22
9,153,413 B2 *  10/2015 Almogy .................. H01J 37/28
(Continued)

FOREIGN PATENT DOCUMENTS

JP    2006-244875 A    9/2006
JP    2021-197263 A    12/2021
(Continued)

OTHER PUBLICATIONS

Taiwanese Office Action dated Jan. 5, 2023 in Taiwanese Patent Application No. 111101359 filed Jan. 13, 2022, (with English Translation, total 10 pages).

*Primary Examiner* — Sean M Luck
(74) *Attorney, Agent, or Firm* — Oblon, McClelland, Maier & Neustadt, L.L.P.

(57) ABSTRACT

According to one aspect of the present invention, a multi-beam image acquisition apparatus, includes: an objective lens configured to image multiple primary electron beams on a substrate by using the multiple primary electron beams; a separator configured to have two or more electrodes for forming an electric field and two or more magnetic poles for forming a magnetic field and configured to separate multiple secondary electron beams emitted due to the substrate being irradiated with the multiple primary electron beams from trajectories of the multiple primary electron beams by the electric field and the magnetic field formed; a deflector configured to deflect the multiple secondary electron beams separated; a lens arranged between the objective lens and the deflector and configured to image the multiple secondary electron beams at a deflection point of the deflector; and a detector configured to detect the deflected multiple secondary electron beams.

10 Claims, 13 Drawing Sheets

(56) References Cited

U.S. PATENT DOCUMENTS

| | | | | |
|---|---|---|---|---|
| 10,121,635 B2* | 11/2018 | Schubert | .................. | H01J 37/28 |
| 10,236,156 B2* | 3/2019 | Ren | ......................... | H01J 37/28 |
| 2001/0010357 A1* | 8/2001 | Ose | ...................... | H01J 37/147 |
| | | | | 250/311 |
| 2003/0066961 A1* | 4/2003 | Kienzle | ................... | H01J 37/28 |
| | | | | 250/311 |
| 2009/0212213 A1 | 8/2009 | Nakasuji et al. | | |
| 2013/0146766 A1* | 6/2013 | Ohshima | ............... | H01J 37/265 |
| | | | | 250/310 |
| 2016/0217967 A1 | 7/2016 | Dohi et al. | | |
| 2018/0233320 A1* | 8/2018 | Ikegami | .................. | H01J 37/04 |
| 2019/0304737 A1* | 10/2019 | Ogasawara | ............ | H05G 2/001 |
| 2020/0013585 A1* | 1/2020 | Inoue | ................. | H01J 37/3045 |

FOREIGN PATENT DOCUMENTS

| | | | |
|---|---|---|---|
| JP | 2022-96502 A | 6/2022 | |
| TW | 202013417 A | 4/2020 | |
| WO | WO 2022/130838 A1 | 6/2022 | |
| WO | WO 2022/239646 A1 | 11/2022 | |

* cited by examiner

Trajectory of Primary Electron Beam

Trajectory of Primary Electron Beam

MULTI-BEAM IMAGE ACQUISITION APPARATUS AND MULTI-BEAM IMAGE ACQUISITION METHOD

CROSS-REFERENCE TO RELATED APPLICATION

This application is based upon and claims the benefit of priority from prior Japanese Patent Application No. 2021-008258 filed on Jan. 21, 2021 in Japan, the entire contents of which are incorporated herein by reference.

BACKGROUND OF THE INVENTION

Field of the Invention

The present invention relates to a multi-beam image acquisition apparatus and a multi-beam image acquisition method. For example, the invention relates to an image acquisition method of a multi-beam inspection apparatus that performs pattern inspection using a secondary electron image caused by emission of multiple primary electron beams.

Related Art

In recent years, with the increase in the integration and capacity of a large-scale integrated circuit (LSI), the circuit pattern linewidth required for semiconductor devices has become narrower and narrower. In addition, improving the yield is indispensable for manufacturing the LSI, which requires a high manufacturing cost. However, as represented by 1-gigabit class DRAM (random access memory), the patterns configuring the LSI are on the order of submicron to nanometer. In recent years, with the decrease in the dimensions of LSI patterns formed on a semiconductor wafer, dimensions that should be detected as pattern defects are also extremely small. Therefore, it is necessary to improve the accuracy of a pattern inspection apparatus for inspecting the defects of ultrafine patterns transferred onto the semiconductor wafer.

For example, the inspection apparatus irradiates an inspection target substrate with multiple beams using electron beams and detects secondary electrons corresponding to each beam emitted from the inspection target substrate to capture a pattern image. In addition, there is known a method of performing an inspection by comparing a captured measurement image with design data or a measurement image obtained by capturing the same pattern on the substrate. For example, there is a "die to die inspection" in which pieces of measurement image data obtained by imaging the same pattern at different locations on the same substrate are compared with each other or a "die to database inspection" in which design image data (reference image) is generated based on pattern-designed design data and the design image data is compared with a measurement image that serves as measurement data obtained by imaging the pattern. The captured images are transmitted to a comparison circuit as measurement data. The comparison circuit aligns the images with each other and then compares the measurement data and the reference data according to an appropriate algorithm. When the measurement data and the reference data do not match each other, the comparison circuit determines that there is a pattern defect.

Here, when an inspection image is acquired by using multiple electron beams, it is required to reduce the pitch between beams in order to realize high resolution. If the pitch between beams is reduced, there is a problem that crosstalk between beams is likely to occur in the detection system. Specifically, when an inspection image is acquired by using multiple electron beams, an E×B (E cross B) separator is arranged on the trajectory of the primary electron beam to separate the secondary electron beam from the primary electron beam. The E×B separator is arranged at the field conjugate position of the primary electron beam where the influence of E×B is small. Then, the primary electron beam is imaged on the target object surface by the objective lens. Between the primary electron beam and the secondary electron beam, the energy of emitted electrons incident on the target object surface and the energy of the generated secondary electrons are different. Therefore, when the primary electron beam forms an intermediate field on the E×B separator, the secondary electron beam forms an intermediate field in front of the E×B separator after passing through the objective lens. For this reason, the secondary electron beam spreads on the E×B separator without forming an intermediate field. As a result, the secondary electrons separated by the E×B separator continue to spread in the detection optical system. Therefore, there is a problem that the aberration occurring in the detection optical system may increase and multiple secondary electron beams may overlap each other on the detector and accordingly, it may be difficult to detect the multiple secondary electron beams individually. In other words, there is a problem that crosstalk between beams is likely to occur. Such a problem is not limited to the inspection apparatus, and may occur similarly in all apparatuses for acquiring an image using multiple electron beams.

Here, a technique is disclosed in which a Wien filter configured by a multi-pole lens having a four-stage configuration for correcting on-axis chromatic aberration is arranged in the secondary electron optics away from the primary electron optics and the on-axis chromatic aberration of the secondary electrons after being separated is corrected (see, for example, JP-A-2006-244875).

BRIEF SUMMARY OF THE INVENTION

According to one aspect of the present invention, a multi-beam image acquisition apparatus, includes:

a stage on which a substrate is placed;

an objective lens configured to image multiple primary electron beams on the substrate by using the multiple primary electron beams;

a separator configured to have two or more electrodes for forming an electric field and two or more magnetic poles for forming a magnetic field and configured to separate multiple secondary electron beams emitted due to the substrate being irradiated with the multiple primary electron beams from trajectories of the multiple primary electron beams by the electric field and the magnetic field formed;

a deflector configured to deflect the multiple secondary electron beams separated;

a lens arranged between the objective lens and the deflector and configured to image the multiple secondary electron beams at a deflection point of the deflector; and a detector configured to detect the deflected multiple secondary electron beams.

According to another aspect of the present invention, a multi-beam image acquisition method, includes:

imaging multiple primary electron beams on a substrate placed on a stage by using an objective lens;

separating multiple secondary electron beams emitted due to the substrate being irradiated with the multiple primary electron beams from trajectories of the multiple primary electron beams by an electric field and a magnetic field formed by using a separator having two or more electrodes for forming an electric field and two or more magnetic poles for forming a magnetic field;

deflecting a separated multiple secondary electron beams by using a deflector;

imaging the multiple secondary electron beams at a deflection point of the deflector by using a lens arranged between the objective lens and the deflector; and detecting a deflected multiple secondary electron beams by using a detector and outputting data of a secondary electron image based on a signal of the detected multiple secondary electron beams.

DETAILED DESCRIPTION OF THE INVENTION

Hereinafter, in an embodiment, an apparatus and a method capable of reducing the aberration occurring in a detection optical system and separating each secondary electron beam of multiple secondary electron beams on the detection surface will be described.

In addition, in the embodiment, a multi-electron beam inspection apparatus will be described below as an example of a multi-electron beam image acquisition apparatus. However, the image acquisition apparatus is not limited to the inspection apparatus, and may be any apparatus that acquires an image by using multiple beams.

Embodiment 1

Figure 1:
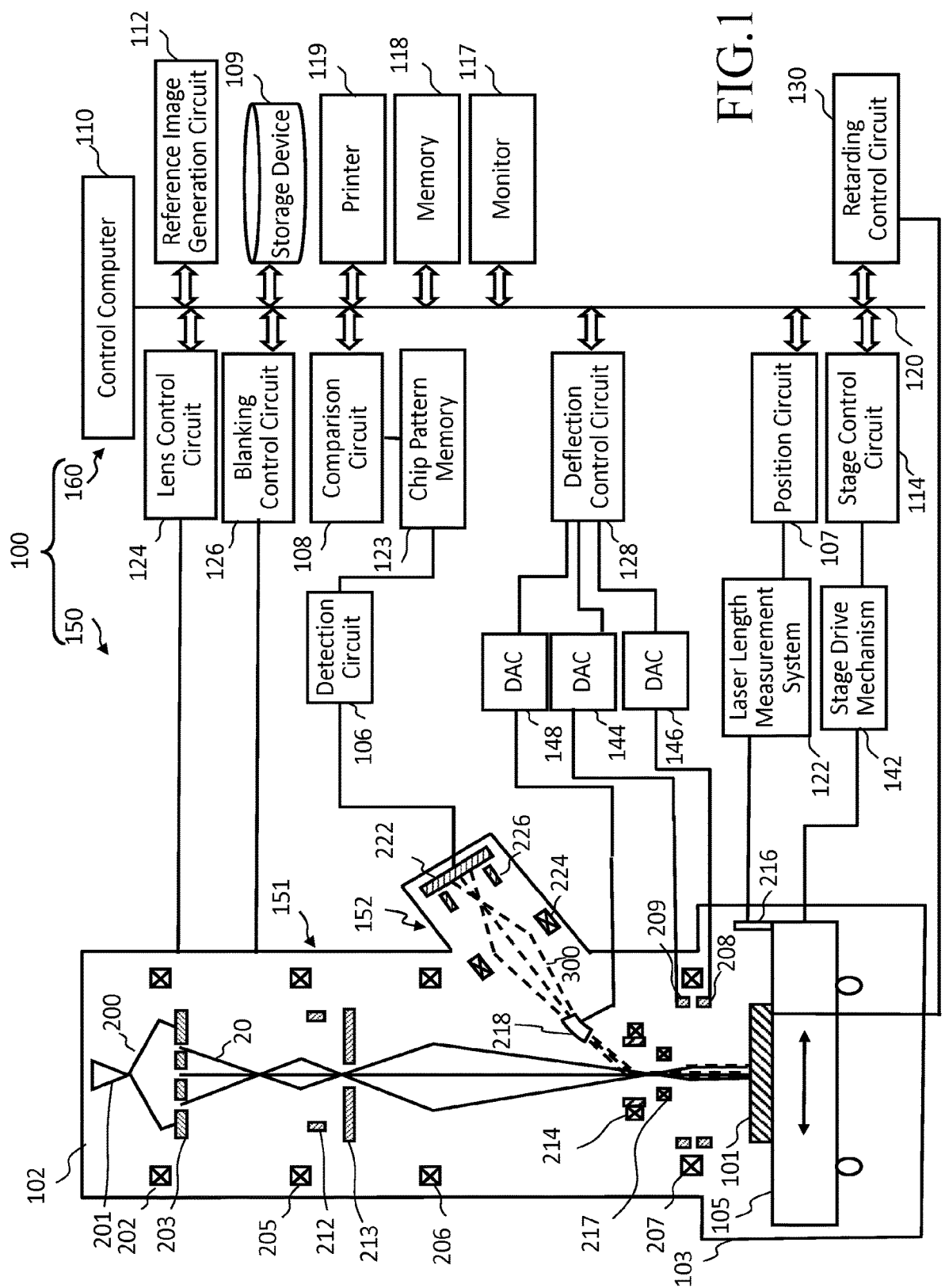
FIG. 1 is a configuration diagram showing the configuration of a pattern inspection apparatus according to Embodiment 1.

FIG. 1 is a configuration diagram showing the configuration of a pattern inspection apparatus according to Embodiment 1. In FIG. 1, an inspection apparatus 100 for inspecting a pattern formed on a substrate is an example of a multi-electron beam inspection apparatus. The inspection apparatus 100 includes an image acquisition mechanism 150 and a control system circuit 160 (control unit). The image acquisition mechanism 150 includes an electron beam column 102 (electron optical column), an inspection room 103, a detection circuit 106, a chip pattern memory 123, a stage drive mechanism 142, and a laser length measurement system 122. An electron gun assembly 201, an illumination lens 202, a shaping aperture array substrate 203, an electromagnetic lens 205, a batch deflector 212, a limited aperture substrate 213, electromagnetic lenses 206 and 207, a main deflector 208, a sub-deflector 209, a beam separator 214, an electromagnetic lens 217, a deflector 218, an electromagnetic lens 224, a deflector 226, and a multi-detector 222 are arranged in the electron beam column 102.

A primary electron optics 151 is configured by the electron gun assembly 201, the electromagnetic lens 202, the shaping aperture array substrate 203, the electromagnetic lens 205, the batch deflector 212, the limited aperture substrate 213, the electromagnetic lens 206, the electromagnetic lens 207 (objective lens), the main deflector 208, and the sub-deflector 209. In addition, a secondary electron optics 152 is configured by the electromagnetic lens 207 (objective lens), the electromagnetic lens 217, the beam separator 214, the deflector 218, the electromagnetic lens 224, and the deflector 226. The electromagnetic lens 217 is arranged between the electromagnetic lens 207 (objective lens) and the deflector 218 with respect to the trajectory of the secondary electron. In the example of FIG. 1, the electromagnetic lens 217 is arranged between the electromagnetic lens 207 (objective lens) and the beam separator 214.

A stage 105 that can move at least in the X and Y directions is arranged in the inspection room 103. A substrate 101 (target object) to be inspected is arranged on the stage 105. Examples of the substrate 101 include an exposure mask substrate and a semiconductor substrate, such as a silicon wafer. When the substrate 101 is a semiconductor substrate, a plurality of chip patterns (wafer dies) are formed on the semiconductor substrate. When the substrate 101 is an exposure mask substrate, a chip pattern is formed on the exposure mask substrate. The chip pattern is configured by a plurality of figures. By exposing and transferring the chip pattern formed on the exposure mask substrate to the semiconductor substrate a plurality of times, a plurality of chip patterns (wafer dies) are formed on the semiconductor substrate. Hereinafter, the case where the substrate 101 is a semiconductor substrate will be mainly described. The substrate 101 is arranged on the stage 105, for example, with the pattern forming surface facing upward. In addition, a mirror 216 that reflects a laser beam for laser length measurement emitted from the laser length measurement system 122 arranged outside the inspection room 103 is arranged on the stage 105.

In addition, the multi-detector 222 is connected to the detection circuit 106 outside the electron beam column 102. The detection circuit 106 is connected to the chip pattern memory 123.

In the control system circuit 160, a control computer 110 that controls the entire inspection apparatus 100 is connected to a position circuit 107, a comparison circuit 108, a reference image generation circuit 112, a stage control circuit 114, a lens control circuit 124, a blanking control circuit 126, a deflection control circuit 128, a retarding control circuit 130, a storage device 109 such as a magnetic disk drive, a monitor 117, a memory 118, and a printer 119 through a bus 120. In addition, the deflection control circuit 128 is connected to DAC (digital-to-analog conversion) amplifiers 144, 146, 148. The DAC amplifier 146 is connected to the main deflector 208, and the DAC amplifier 144 is connected to the sub-deflector 209. The DAC amplifier 148 is connected to the deflector 218.

In addition, the chip pattern memory 123 is connected to the comparison circuit 108. In addition, the stage 105 is driven by the stage drive mechanism 142 under the control of the stage control circuit 114. In the stage drive mechanism 142, for example, a drive system such as a three-axis (X-Y-θ) motor for driving in the X, Y, and θ directions in the stage coordinate system is configured, so that the stage 105 can move in the X, Y, and θ directions. As these X motor, Y motor, and θ motor (not shown), for example, step motors can be used. The stage 105 can be moved in the horizontal direction and the rotational direction by a motor of each axis of X, Y, and θ. Then, the moving position of the stage 105 is measured by the laser length measurement system 122 and supplied to the position circuit 107. The laser length measurement system 122 measures the position of the stage 105 based on the principle of the laser interferometry by receiving light reflected from the mirror 216. In the stage coordinate system, for example, X, Y, and θ directions of the primary coordinate system are set with respect to the plane perpendicular to the optical axis of multiple primary electron beams 20.

The electromagnetic lens 202, the electromagnetic lens 205, the electromagnetic lens 206, the electromagnetic lens 207, the electromagnetic lens 217, the electromagnetic lens 224, and the beam separator 214 are controlled by the lens control circuit 124. In addition, the batch deflector 212 is configured by two or more electrodes, and each of the electrodes is controlled by the blanking control circuit 126 through a DAC amplifier (not shown). The sub-deflector 209 is configured by four or more electrodes, and each of the electrodes is controlled by the deflection control circuit 128 through the DAC amplifier 144. The main deflector 208 is configured by four or more electrodes, and each of the electrodes is controlled by the deflection control circuit 128 through the DAC amplifier 146. The deflector 218 is a two-stage deflector configured by four or more electrodes, and each of the electrodes is controlled by the deflection control circuit 128 through the DAC amplifier 148. In addition, the deflector 226 is configured by four or more electrodes, and each of the electrodes is controlled by the deflection control circuit 128 through a DAC amplifier (not shown). The retarding control circuit 130 applies a desired retarding potential to the substrate 101 to adjust the energy of the multiple primary electron beams 20 emitted to the substrate 101.

A high-voltage power supply circuit (not shown) is connected to the electron gun assembly 201, and a group of electrons emitted from the cathode are accelerated by the application of an acceleration voltage from the high-voltage power supply circuit between a filament and an extraction electrode (not shown) in the electron gun assembly 201, the application of a voltage to a predetermined extraction electrode (Wenert), and the heating of the cathode at a predetermined temperature, and are emitted as electron beam 200.

Here, FIG. 1 describes components necessary for explaining Embodiment 1. The inspection apparatus 100 may usually include other necessary components.

Figure 2:
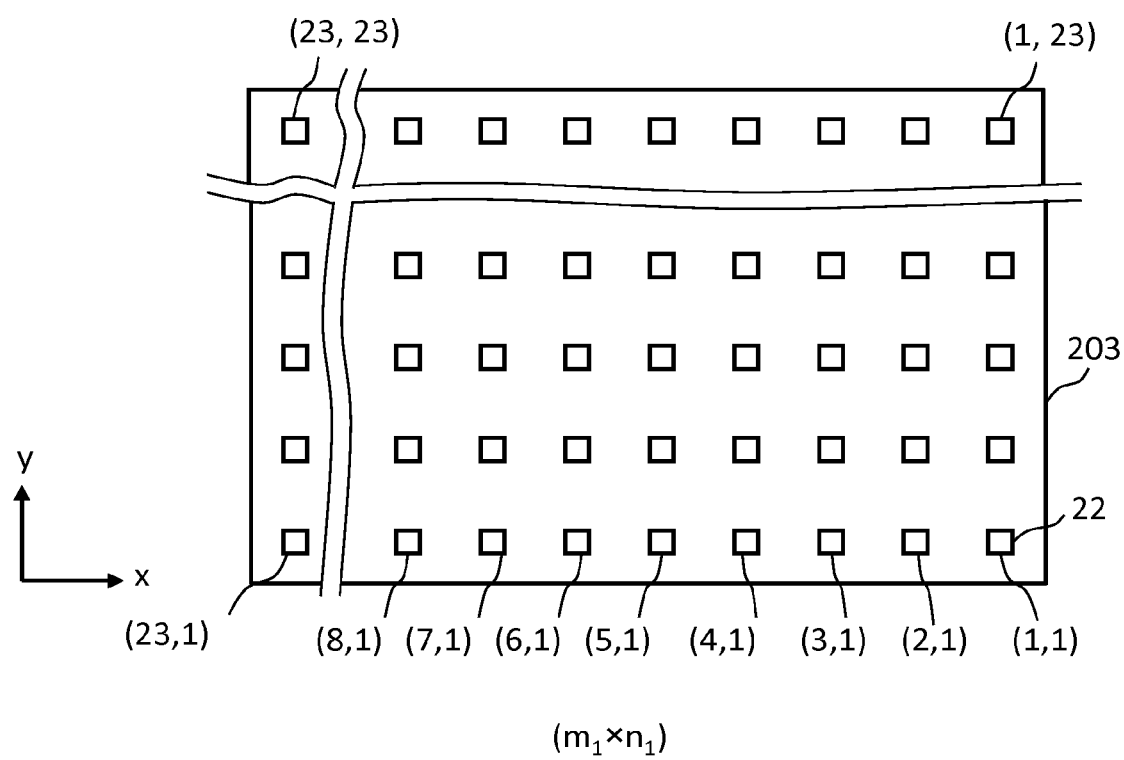
FIG. 2 is a conceptual diagram showing the configuration of a shaping aperture array substrate according to Embodiment 1.

FIG. 2 is a conceptual diagram showing the configuration of a shaping aperture array substrate according to Embodiment 1. In FIG. 2, on the shaping aperture array substrate 203, holes (openings) 22 having a two-dimensional shape of $m_1$ columns wide (x direction))×$n_1$ rows long (y direction)) ($m_1$ and $n_1$ are integers of 2 or more) are formed at predetermined arrangement pitches in the x and y directions. In the example of FIG. 2, a case where 23×23 holes (openings) 22 are formed is shown. The holes 22 are formed in rectangles having the same dimension and shape. Alternatively, the holes 22 may be circles having the same outer diameter. Parts of the electron beam 200 pass through the plurality of holes 22 to form the multiple primary electron beams 20. The shaping aperture array substrate 203 is an example of a multi-beam forming mechanism for forming multiple primary electron beams.

The image acquisition mechanism 150 acquires an image to be inspected of a figure from the substrate 101 on which the figure is formed by using multiple beams using electron beams. Hereinafter, the operation of the image acquisition mechanism 150 in the inspection apparatus 100 will be described.

The electron beam 200 emitted from the electron gun assembly 201 (emission source) are refracted by the electromagnetic lens 202 to illuminate the entire shaping aperture array substrate 203. As shown in FIG. 2, a plurality of holes 22 (openings) are formed on the shaping aperture array substrate 203, and a region including all of the plurality of holes 22 is illuminated with the electron beam 200. Parts of the electron beam 200 emitted to the positions of the plurality of holes 22 pass through the plurality of holes 22 on the shaping aperture array substrate 203 to form the multiple primary electron beams 20.

The formed multiple primary electron beams 20 are refracted by the electromagnetic lens 205 and the electromagnetic lens 206, pass through the beam separator 214, which is arranged at the intermediate field (field conjugate position: I. I. P.) of each of the multiple primary electron beams 20, while repeating an intermediate image and crossover, and travel to the electromagnetic lens 207. In addition, scattered beams can be shielded by arranging the limited aperture substrate 213 having a limited passage hole near the crossover position of the multiple primary electron beams 20. In addition, all of the multiple primary electron beams 20 can be blanked by collectively deflecting all of the multiple primary electron beams 20 using the batch deflector 212 and shielding all of the multiple primary electron beams 20 with the limited aperture substrate 213.

When the multiple primary electron beams 20 are incident on the electromagnetic lens 207 (objective lens), the electromagnetic lens 207 focuses the multiple primary electron beams 20 on the substrate 101. In other words, the electromagnetic lens 207 irradiates the substrate 101 with the multiple primary electron beams 20. The multiple primary electron beams 20 focused on the surface of the substrate 101 (target object) by the objective lens 207 are collectively deflected by the main deflector 208 and the sub-deflector 209, and are emitted to the irradiation position of each beam on the substrate 101. In this manner, the primary electron optics 151 irradiates the surface of the substrate 101 with multiple primary electron beams.

When the multiple primary electron beams 20 are emitted to a desired position of the substrate 101, a group of secondary electrons (multiple secondary electron beams 300) including reflected electrons, which correspond to the multiple primary electron beams 20, are emitted from the substrate 101 due to the emission of the multiple primary electron beams 20.

The multiple secondary electron beams 300 emitted from the substrate 101 pass through the electromagnetic lens 207 and travel to the beam separator 214.

Here, the beam separator 214 (E×B separator) has a plurality (two or more) of magnetic poles using a coil and a plurality (two or more) of electrodes. Then, a directional magnetic field is generated by the plurality of magnetic poles. Similarly, a directional electric field is generated by the plurality of electrodes. Specifically, the beam separator 214 generates an electric field and a magnetic field so as to be perpendicular to each other on a plane perpendicular to a direction in which the central beam of the multiple primary electron beams 20 travels (central axis of trajectory). The electric field applies a force in the same direction regardless of the traveling direction of the electron. On the other hand, the magnetic field applies a force according to the Fleming's left-hand rule. Therefore, the direction of the force acting on the electron can be changed depending on the electron incidence direction. In the multiple primary electron beams 20 incident on the beam separator 214 from above, the force due to the electric field and the force due to the magnetic field cancel each other out. Therefore, the multiple primary electron beams 20 travel straight downward. On the other hand, in the multiple secondary electron beams 300 incident on the beam separator 214 from below, both the force due to the electric field and the force due to the magnetic field act in the same direction. Therefore, the multiple secondary electron beams 300 are bent obliquely upward and separated from the trajectory of the multiple primary electron beams 20.

The multiple secondary electron beams 300, which are bent obliquely upward and separated from the multiple primary electron beams 20, are guided to the multi-detector 222 by the secondary electron optics 152. Specifically, the multiple secondary electron beams 300 separated from the multiple primary electron beams 20 are further bent by being deflected by the deflector 218, and are projected onto the multi-detector 222 while being refracted in the focusing direction by the electromagnetic lens 224 at a position away from the trajectory of the multiple primary electron beams 20. In other words, the deflector 218 deflects the multiple secondary electron beams 300 so that the central axis trajectory of the multiple secondary electron beams 300 separated by the beam separator 214 is directed toward the multi-detector 222. Then, the multiple secondary electron beams 300 whose central axis trajectory is directed toward the multi-detector 222 are projected onto the multi-detector 222 by the electromagnetic lens 224. The multi-detector 222 (multiple secondary electron beams detector) detects the refracted and projected multiple secondary electron beams 300. The multi-detector 222 has a plurality of detection elements (for example, diode type two-dimensional sensors (not shown)). Then, each of the multiple primary electron beams 20 collides with a detection element corresponding to each of the multiple secondary electron beams 300 on the detection surface of the multi-detector 222 to generate electrons, thereby generating secondary electron image data for each pixel. The intensity signal detected by the multi-detector 222 is output to the detection circuit 106.

Figure 3A:
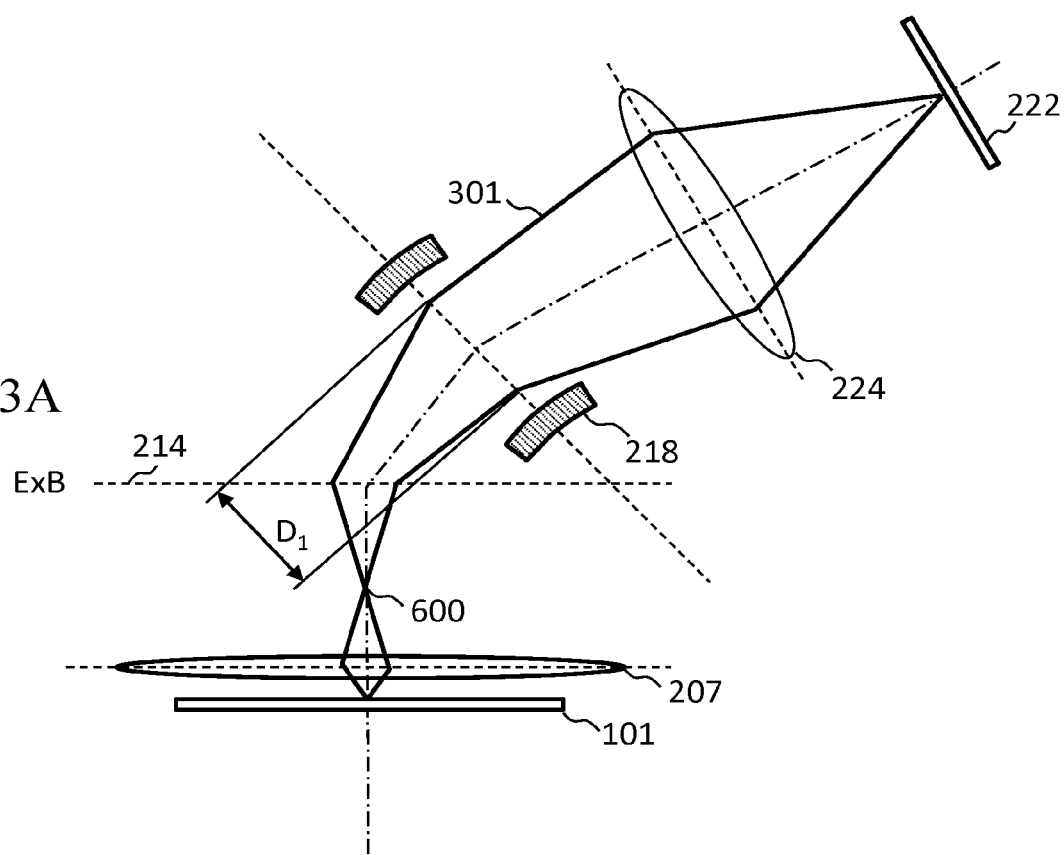
FIGS. 3A and 3B are diagrams showing an example of the trajectory of multiple secondary electron beams and an example of the trajectory of multiple primary electron beams in a comparative example of Embodiment 1.
Figure 3B:
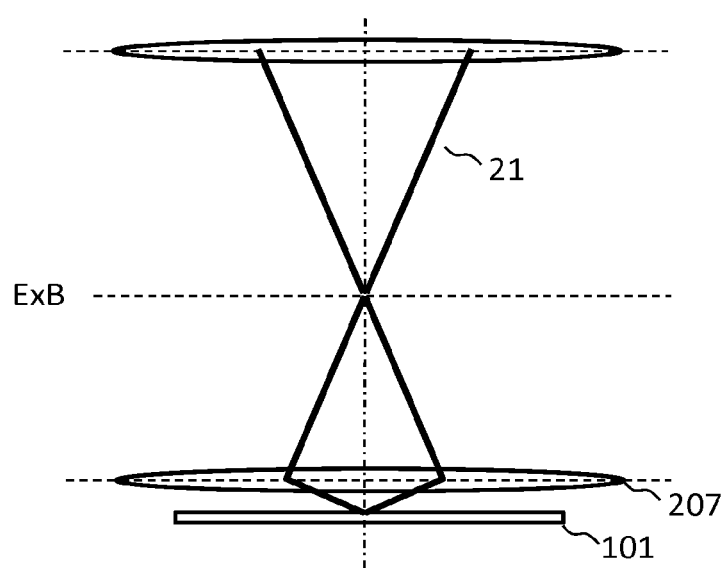

FIGS. 3A and 3B are diagrams showing an example of the trajectory of multiple secondary electron beams and an example of the trajectory of multiple primary electron beams in a comparative example of Embodiment 1. FIG. 3A shows an example of the trajectory of multiple secondary electron beams in the comparative example. FIG. 3B shows an example of the trajectory of multiple primary electron beams in the comparative example. The multiple primary electron beams 20 spread through the beam separator 214 arranged at the field conjugate position, and the trajectory of the multiple primary electron beams 20 is bent in the focusing direction by the electromagnetic lens 207 (objective lens) to form an image on the surface of the substrate 101. FIG. 3B shows the trajectory of the central primary electron beam 21 among the multiple primary electron beams 20. In addition, the energy at the time of emission of the central secondary electron beam 301 corresponding to the central primary electron beam 21, among the multiple secondary electron beams 300 emitted from the substrate 101, is smaller than the incidence energy of the central primary electron beam 21 to the substrate 101. For this reason, under the condition that the primary electron beam is imaged on the surface of the beam separator 214 and the electromagnetic lens 207 focuses the multiple primary electron beams 20 on the substrate 101, as shown in FIG. 3A, the trajectory of the central secondary electron beam 301 is bent in the focusing direction by the electromagnetic lens 207 (objective lens), but an intermediate image plane 600 (imaging point) is formed at a position before reaching the beam separator 214. Thereafter, the central secondary electron beam 301 travels to the beam separator 214 while spreading. Then, in the comparative example, the central secondary electron beam 301 travels to the deflector 218 while further spreading. As a result, the beam diameter D1 of the central secondary electron beam 301 increases at the position of the deflector 218. Similarly, the beam diameters of the other secondary electron beams increase. The larger the beam diameter D1 of each secondary electron beam, the larger the aberration occurring in the deflector 218. For this reason, even if an attempt is made to make the secondary electron beams after passing through the deflector 218 converge by the lens work of the electromagnetic lens 224, the beam diameter cannot be reduced on the detection surface of the multi-detector 222, and the secondary electron beams overlap each other. Therefore, separation between the secondary electron beams may be difficult. As a result, it becomes difficult to detect the secondary electron beams individually. In addition, when the objective lens gives priority to the focusing of the primary electron beam, it is difficult in principle to align the focus of the secondary electron beam with the position of the deflector 218.

Figure 4A:
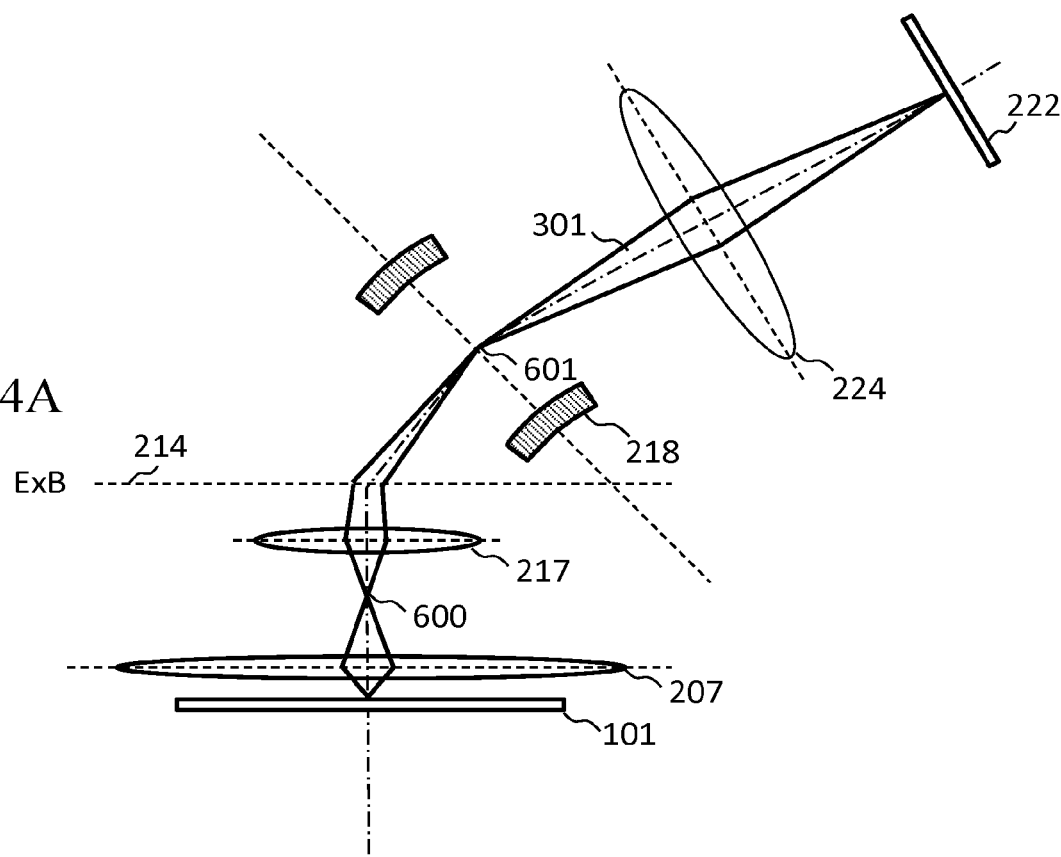
FIGS. 4A and 4B are diagrams showing an example of the trajectory of multiple secondary electron beams and an example of the trajectory of multiple primary electron beams in Embodiment 1.
Figure 4B:
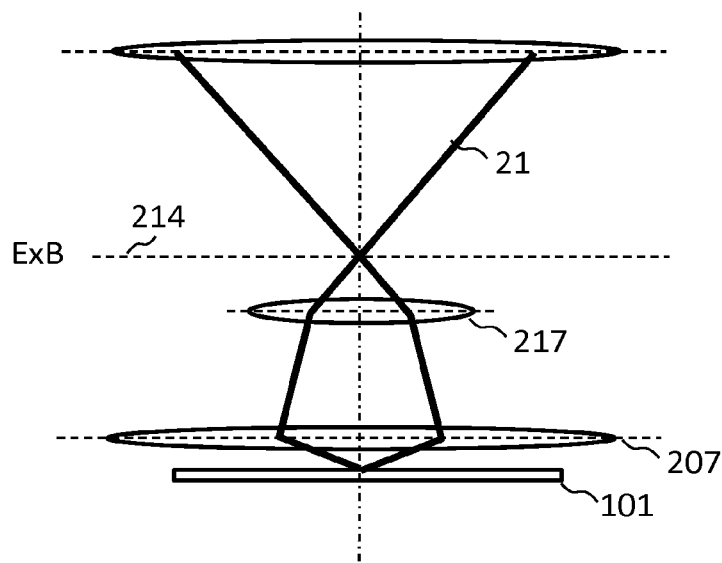

FIGS. 4A and 4B are diagrams showing an example of the trajectory of multiple secondary electron beams and an example of the trajectory of multiple primary electron beams in Embodiment 1. FIG. 4A shows an example of the trajectory of multiple secondary electron beams in Embodiment 1. FIG. 4B shows an example of the trajectory of multiple primary electron beams in Embodiment 1. In Embodiment 1, as shown in FIG. 4B, the multiple primary electron beams 20 spread through the beam separator 214 arranged at the field conjugate position and are refracted by the electromagnetic lens 217. The multiple primary electron beams 20 continue to spread toward the electromagnetic lens 207 (objective lens) even though the trajectory of the multiple primary electron beams 20 is slightly changed by the electromagnetic lens 217, and the trajectory is bent in the focusing direction by the electromagnetic lens 207 (objective lens) to form an image on the surface of the substrate 101. FIG. 4B shows the trajectory of the central primary electron beam 21 among the multiple primary electron beams 20. Under the condition that such a primary electron beam is imaged on the surface of the beam separator 214 and the electromagnetic lens 207 focuses the multiple primary electron beams 20 on the substrate 101, as in the comparative example, the trajectory of the central secondary electron beam 301 is bent in the focusing direction by the electromagnetic lens 207 (objective lens), but an intermediate image plane 600 (imaging point) is formed at a position before reaching the beam separator 214.

Here, in Embodiment 1, the trajectory is bent in the focusing direction by the electromagnetic lens 207 (objective lens) to form the intermediate image plane 600 (imaging point), and the trajectory of the multiple secondary electron beams in the divergence direction is bent in the focusing direction by the electromagnetic lens 217. At that time, the electromagnetic lens 217 forms an intermediate image plane 601 (imaging point) of the multiple secondary electron beams at the deflection point of the deflector 218. As described above, the multiple secondary electron beams 300 are refracted by the electromagnetic lens 217 before being separated from the trajectory of the multiple primary electron beams 20, and as a result, an image of the multiple secondary electron beams 300 is formed on the deflection point of the deflector 218. The deflection point may be, for example, the intersection of an extension line of a central axis trajectory of the multiple secondary electron beams 300 before deflection and an extension line of a central axis trajectory of the multiple secondary electron beams 300 after deflection by a deflector. In this manner, as shown in FIG. 4A, the beam diameter of the central secondary electron beam 301 can be reduced at the position of the deflection point in the deflector 218. Thus, it is possible to suppress the aberration occurring in the deflector 218. Therefore, the beam diameter can be reduced on the detection surface of the multi-detector 222 by the lens work of the electromagnetic lens 224 after the secondary electron beams pass through the deflector 218, and an image can be formed on the detection surface of the multi-detector 222 in a state in which the secondary electron beams are separated. As a result, it is possible to detect the secondary electron beams individually. Therefore, the deflection point of the deflector 218 is conjugated to the surface of the substrate 101 and the detection surface of the multi-detector 222.

In addition, it is preferable that the deflector 218 is formed so that its cross section cut by the plane including the central axis of the trajectory of the secondary electron is an arc shape. However, the invention is not limited thereto. The deflector 218 may be formed so that its cross section cut by the plane including the central axis of the trajectory of the secondary electron is a rectangular shape. In Embodiment 1, the position of the midpoint of the length of the central axis in the deflector 218 through which the central secondary electron beam 301 passes is assumed to be the deflection point (or the deflection center).

Figure 5:
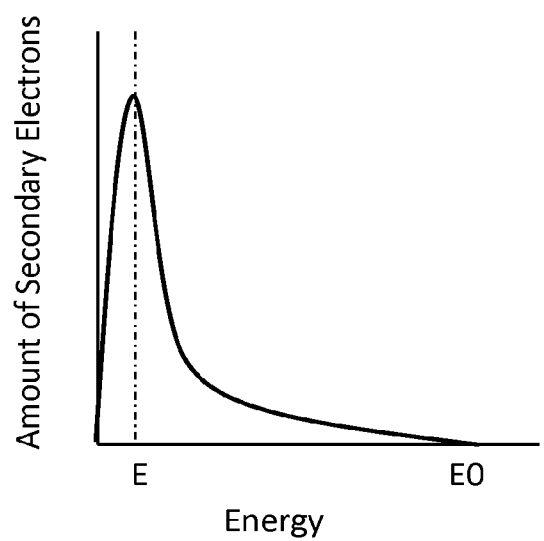
FIG. 5 is a diagram showing a relationship between the amount of secondary electrons and energy in Embodiment 1.

FIG. 5 is a diagram showing a relationship between the amount of secondary electrons and energy in Embodiment 1. In FIG. 5, the vertical axis indicates the amount of secondary electrons and the horizontal axis indicates the magnitude of energy. Secondary electrons having different energies are emitted from the substrate 101. In the example of FIG. 5, the energy of the secondary electron has a width of 0<secondary electron<E0. In Embodiment 1, the electromagnetic lens 217 is controlled so that the imaging point of the secondary electrons with energy E indicating the peak in the energy distribution shown in FIG. 5 is formed at the deflection point of the deflector 218.

Figure 6:
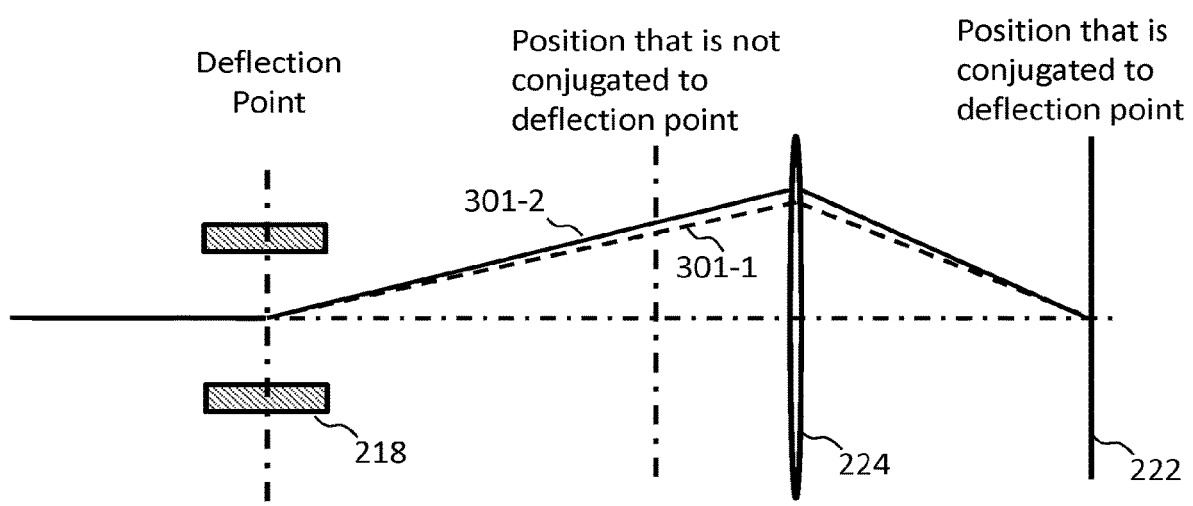
FIG. 6 is a diagram showing an example of the trajectory of the secondary electron beam between the deflection point and the detection surface in Embodiment 1.

FIG. 6 is a diagram showing an example of the trajectory of the secondary electron beam between the deflection point and the detection surface in Embodiment 1. In FIG. 6, the amount of deflection of the secondary electron by the deflector 218 changes according to the magnitude of its own energy. As shown in the example of FIG. 6, a secondary electron 301-2 (solid line) having low energy is bent more than a secondary electron 301-1 (dotted line) having high energy. Here, at a position that is not conjugated to the deflection point of the deflector 218, as shown in FIG. 6, the trajectory of the secondary electron deviates depending on the magnitude of energy and accordingly, the image is blurred. On the other hand, in Embodiment 1, since the deflection point of the deflector 218 is conjugated to the detection surface of the multi-detector 222, the secondary electron returns to the center of the trajectory on the detection surface of the multi-detector 222 regardless of the magnitude of energy. Therefore, it is possible to suppress the blurring of the secondary electron beam on the detection surface of the multi-detector 222.

Figure 7:
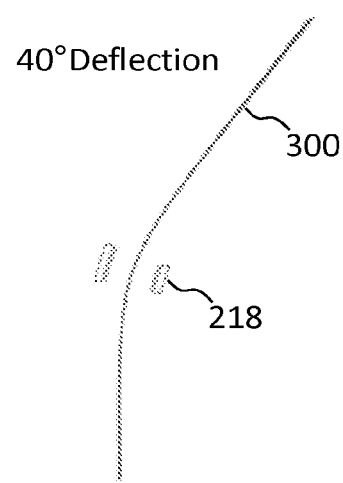
FIG. 7 is a diagram showing the 40° deflection trajectory of multiple secondary electron beams in Embodiment 1.

FIG. 7 is a diagram showing the 40° deflection trajectory of multiple secondary electron beams in Embodiment 1. In the example of FIG. 7, a case is shown in which the multiple secondary electron beams 300 are deflected by, for example, 40° by the deflector 218.

Figure 8:
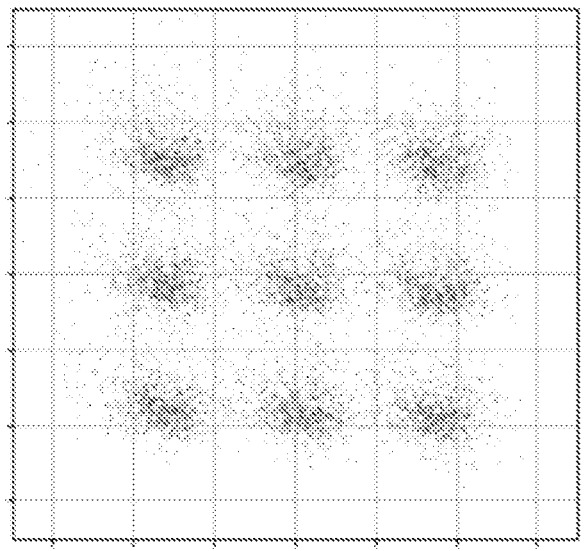
FIG. 8 is a diagram showing an example of the distribution of secondary electrons detected by 40° deflection in Embodiment 1.

FIG. 8 is a diagram showing an example of the distribution of secondary electrons detected by 40° deflection in Embodiment 1. In the example of FIG. 8, a case of detecting the 3×3 multiple secondary electron beams 300 is shown. By arranging the deflector 218 at a position where the deflection point of the deflector 218 is conjugated to the surface of the substrate 101 and the detection surface of the multi-detector 222, as shown in FIG. 8, the multiple secondary electron beams 300 can be separated and detected on the detection surface of the multi-detector 222 when the multiple secondary electron beams 300 are deflected by, for example, 40°.

Figure 9:
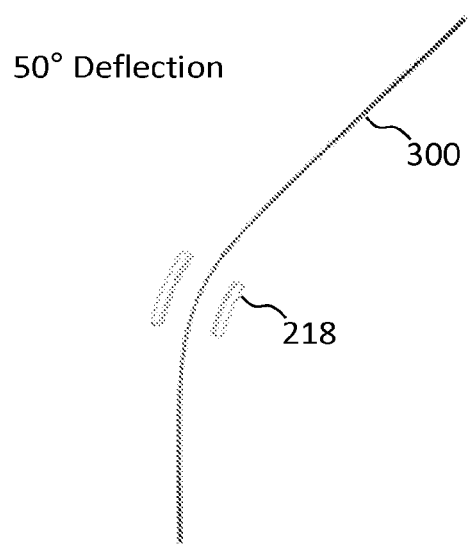
FIG. 9 is a diagram showing the 50° deflection trajectory of multiple secondary electron beams in Embodiment 1.

FIG. 9 is a diagram showing the 50° deflection trajectory of multiple secondary electron beams in Embodiment 1. In the example of FIG. 9, a case is shown in which the multiple secondary electron beams 300 are deflected by, for example, 50° by the deflector 218.

Figure 10:
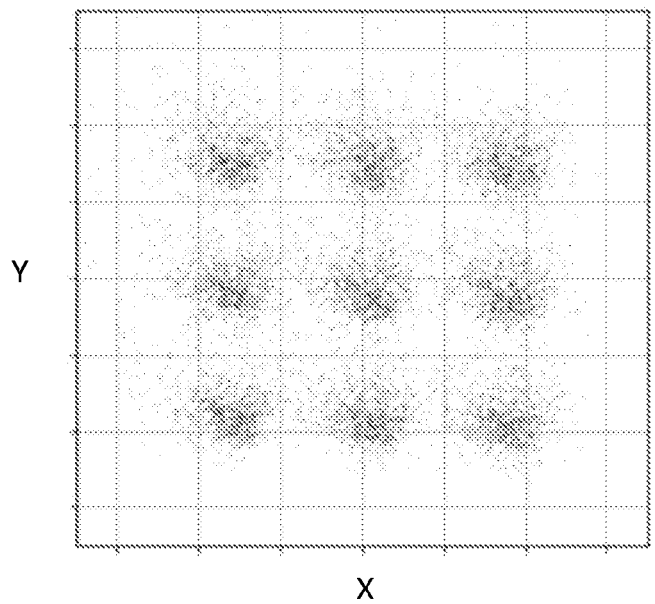
FIG. 10 is a diagram showing an example of the distribution of secondary electrons detected by 50° deflection in Embodiment 1.

FIG. 10 is a diagram showing an example of the distribution of secondary electrons detected by 50° deflection in Embodiment 1. In the example of FIG. 10, a case of detecting the 3×3 multiple secondary electron beams 300 is shown. By arranging the deflector 218 at a position where the deflection point of the deflector 218 is conjugated to the surface of the substrate 101 and the detection surface of the multi-detector 222, as shown in FIG. 10, the multiple secondary electron beams 300 can be separated and detected on the detection surface of the multi-detector 222 when the multiple secondary electron beams 300 are deflected by, for example, 50°.

As described above, in Embodiment 1, since the deflector 218 is arranged at a position where the deflection point of the deflector 218 is conjugated to the surface of the substrate 101 and the detection surface of the multi-detector 222, the multiple secondary electron beams 300 can be separated and detected even when the amount of deflection by the deflector 218 is changed. In addition, FIGS. 7 and 9 show a case of changing the deflection angle by changing the length of the deflector 218, but the invention is not limited thereto. The same effect can be obtained by changing the applied voltage using the deflector 218 of the same length. Even when the voltage applied to the deflector 218 is changed, the multiple secondary electron beams 300 can be separated and detected by arranging the deflector 218 at the position where the deflection point of the deflector 218 is conjugated to the surface of the substrate 101 and the detection surface of the multi-detector 222.

Figure 11:
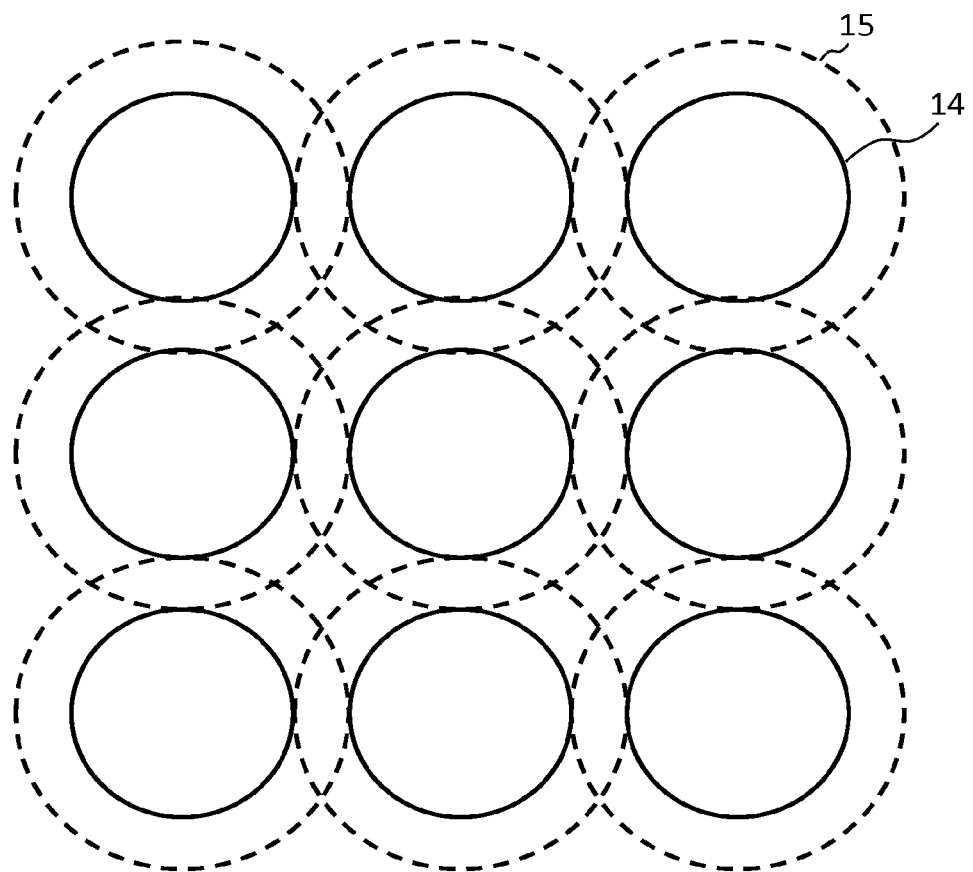
FIG. 11 is a diagram showing an example of the beam diameter of multiple secondary electron beams on the detection surface of a multi-detector in Embodiment 1 and the comparative example.

FIG. 11 is a diagram showing an example of the beam diameter of multiple secondary electron beams on the detection surface of a multi-detector in Embodiment 1 and the comparative example. In the comparative example described above, since the aberration in the deflector 218 increases, the beam diameter of each beam 15 of the multiple secondary electron beams 300 on the detection surface of the multi-detector 222 increases. As a result, as shown in FIG. 11, the beams 15 may overlap each other. On the other hand, according to Embodiment 1, since the aberration in the deflector 218 can be suppressed, the beam diameter of each beam 14 of the multiple secondary electron beams 300 on the detection surface of the multi-detector 222 can be reduced. As a result, as shown in FIG. 11, it is possible to prevent the beams 14 from overlapping each other. Therefore, the secondary system can have high resolution at the position of the multi-detector 222 (separation on the detection surface is possible).

After adjusting the electron optics as described above, inspection processing on the substrate to be inspected is performed.

Figure 12:
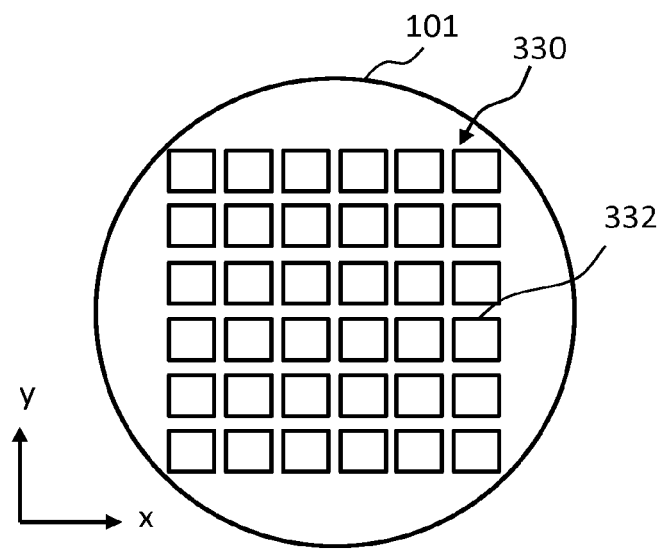
FIG. 12 is a diagram showing an example of a plurality of chip regions formed on a semiconductor substrate in Embodiment 1.

FIG. 12 is a diagram showing an example of a plurality of chip regions formed on a semiconductor substrate in Embodiment 1. In FIG. 12, a plurality of chips (wafer dies) 332 are formed in a two-dimensional array in an inspection region 330 of a semiconductor substrate (wafer) 101. A mask pattern for one chip formed on an exposure mask substrate is transferred to each chip 332 so as to be reduced to, for example, ¼ by an exposure apparatus (stepper) (not shown).

Figure 13:
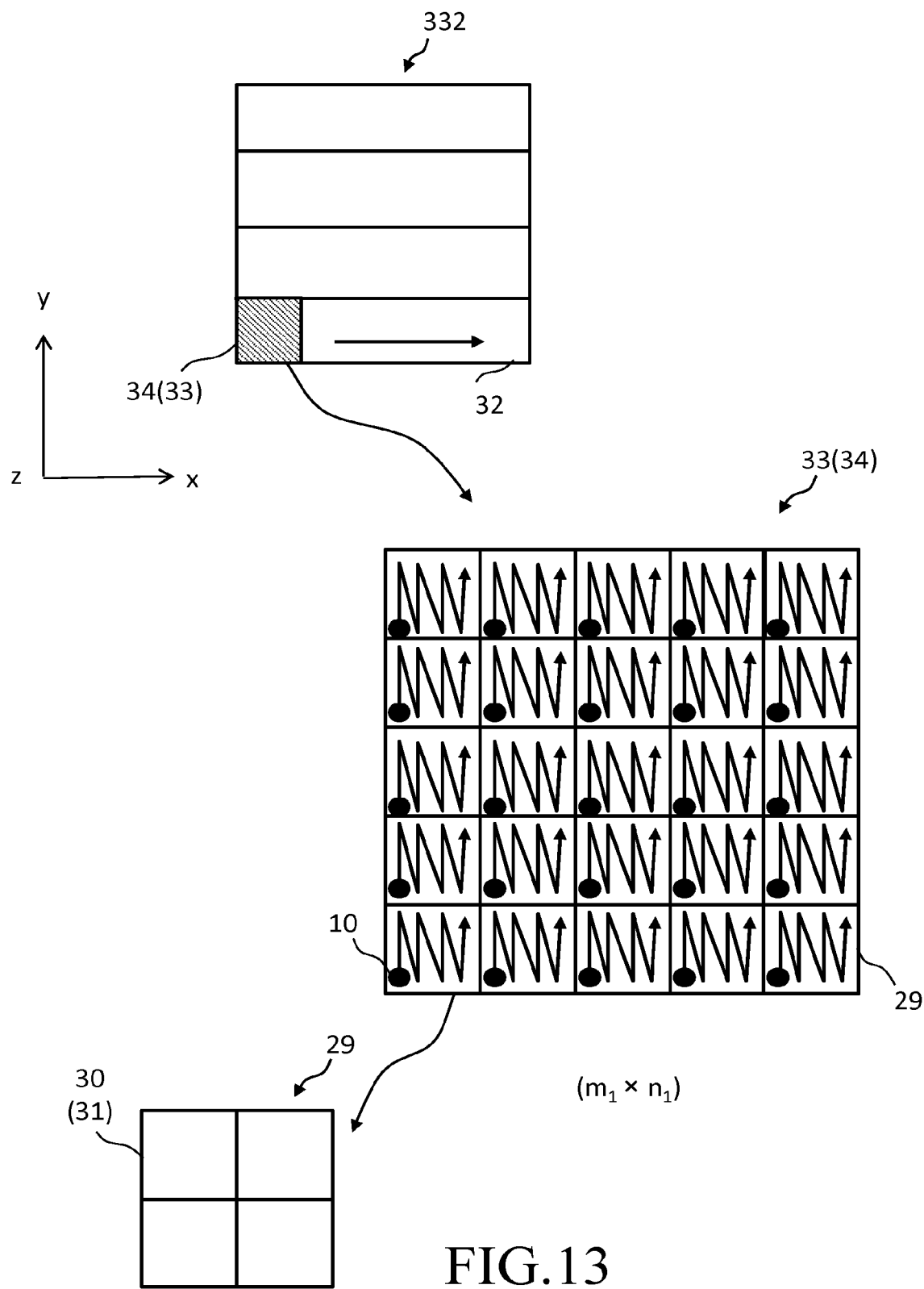
FIG. 13 is a diagram for explaining image acquisition processing in Embodiment 1.

FIG. 13 is a diagram for explaining image acquisition processing in Embodiment 1. As shown in FIG. 13, the region of each chip 332 is divided into a plurality of stripe regions 32 with a predetermined width in the y direction, for example. The scanning operation of the image acquisition mechanism 150 is performed, for example, for each stripe region 32. For example, while moving the stage 105 in the −x direction, the scanning operation on the stripe region 32 is performed relatively in the x direction. Each stripe region 32 is divided into a plurality of rectangular regions 33 in the longitudinal direction. The movement of the beam to the target rectangular region 33 is performed by collectively deflecting all of the multiple primary electron beams 20 using the main deflector 208.

In the example of FIG. 13, for example, a case of 5×5 multiple primary electron beams 20 is shown. An irradiation region 34 that can be irradiated by one emission of the multiple primary electron beams 20 is defined by (x-direction size obtained by multiplying the x-direction beam-to-beam pitch of the multiple primary electron beams 20 on the surface of the substrate 101 by the number of x-direction beams)×(y-direction size obtained by multiplying the y-direction beam-to-beam pitch of the multiple primary electron beams 20 on the surface of the substrate 101 by the number of y-direction beams). The irradiation region 34 is a field of view of the multiple primary electron beams 20. Then, each primary electron beam 10 forming the multiple primary electron beams 20 is emitted into a sub-irradiation region 29 surrounded with the x-direction beam-to-beam pitch and the y-direction beam-to-beam pitch in which the beam itself is located, thereby scanning (scanning operation) the inside of the sub-irradiation region 29. Each primary electron beam 10 is responsible for any of the sub-irradiation regions 29 that are different from each other. Then, each primary electron beam 10 is emitted to the same position in the corresponding sub-irradiation region 29. The sub-deflector 209 (first deflector) collectively deflects the multiple primary electron beams 20 to scan the surface of the substrate 101 on which patterns are formed with the multiple primary electron beams 20. In other words, the movement of the primary electron beam 10 in the sub-irradiation region 29 is performed by collectively deflecting all of the multiple primary electron beams 20 using the sub-deflector 209. This operation is repeated to sequentially irradiate the inside of one sub-irradiation region 29 with one primary electron beam 10.

It is preferable that the width of each stripe region 32 is set to a size similar to the y-direction size of the irradiation region 34 or a size reduced by the scan margin. In the example of FIG. 13, a case where the irradiation region 34 has the same size as the rectangular region 33 is shown. However, the invention is not limited thereto. The irradiation region 34 may be smaller than the rectangular region 33. Alternatively, the irradiation region 34 may be larger than the rectangular region 33. Then, each primary electron beam 10 forming the multiple primary electron beams 20 is emitted into the sub-irradiation region 29 where the beam itself is located, thereby scanning (scanning operation) the inside of the sub-irradiation region 29. Then, after the end of the scanning of one sub-irradiation region 29, the irradiation position is moved to the adjacent rectangular region 33 in the same stripe region 32 by collective deflection of all of the multiple primary electron beams 20 using the main deflector 208. This operation is repeated to irradiate the inside of the stripe region 32 in order. After the end of the scanning of one stripe region 32, the irradiation region 34 is moved to the next stripe region 32 by the movement of the stage 105 and/or collective deflection of all of the multiple primary electron beams 20 using the main deflector 208. As described above, by emitting each primary electron beam 10, the scanning operation for each sub-irradiation region 29 and the acquisition of a secondary electron image are performed. By combining the secondary electron images for the respective sub-irradiation regions 29, a secondary electron image of the rectangular region 33, a secondary electron image of the stripe region 32, or a secondary electron image of the chip 332 is formed. In addition, when actually performing image comparison, the sub-irradiation region 29 in each rectangular region 33 is further divided into a plurality of frame regions 30, and frame images 31 that are measurement images for the respective frame regions 30 are compared. In the example of FIG. 13, a case is shown in which the sub-irradiation region 29 scanned with one primary electron beam 10 is divided into four frame regions 30 that are formed by equally dividing the sub-irradiation region 29 in the x and y directions, for example.

Here, when the substrate 101 is irradiated with the multiple primary electron beams 20 while the stage 105 continuously moves, a tracking operation by collective deflection of the main deflector 208 is performed so that the irradiation position of the multiple primary electron beams 20 follows the movement of the stage 105. Therefore, the emission positions of the multiple secondary electron beams 300 change from moment to moment with respect to the central axis of the trajectory of the multiple primary electron beams 20. Similarly, when scanning the inside of the sub-irradiation region 29, the emission position of each secondary electron beam changes from moment to moment in the sub-irradiation region 29. For example, the deflector 226 collectively deflects the multiple secondary electron beams 300 so that each secondary electron beam whose emission position has changed is emitted into the corresponding detection region of the multi-detector 222. Apart from the deflector 226, it is also preferable to arrange an alignment coil or the like in the secondary electron optics to correct such an emission position change.

As described above, the image acquisition mechanism 150 performs the scanning operation for each stripe region 32. As described above, the multiple primary electron beams 20 are emitted, and the multiple secondary electron beams 300 emitted from the substrate 101 due to the emission of the multiple primary electron beams 20 form an intermediate field in the deflector 218 and at the same time, are deflected by the deflector 218 and then detected by the multi-detector 222. The detected multiple secondary electron beams 300 may include reflected electrons. Alternatively, the reflected electrons may diverge while moving through the secondary electron optics and may not reach the multi-detector 222. Then, a secondary electron image based on the signal of the detected multiple secondary electron beams 300 is acquired. Specifically, detection data of the secondary electrons (measurement image data, secondary electron image data, or image data to be inspected) for each pixel in each sub-irradiation region 29 detected by the multi-detector 222 is output to the detection circuit 106 in the order of measurement. In the detection circuit 106, analog detection data is converted into digital data by an A/D converter (not shown) and stored in the chip pattern memory 123. Then, the obtained measurement image data is transmitted to the comparison circuit 108 together with information indicating each position from the position circuit 107.

On the other hand, the reference image generation circuit 112 generates a reference image corresponding to the frame image 31 for each frame region 30 based on design data that is the basis of a plurality of figures formed on the substrate 101. Specifically, the reference image generation circuit 112 operates as follows. First, design pattern data is read out from the storage device 109 through the control computer 110, and each figure defined in the read design pattern data is converted into binary or multi-valued image data.

As described above, the figures defined in the design pattern data include, for example, a basic figure of a rectangle or a triangle. For example, figure data is stored in which the shape, size, position, and the like of each figure are defined by information such as the coordinates (x, y) at the reference position of the figure, the length of the side, and a figure code that serves as an identifier for identifying the figure type such as a rectangle or a triangle.

When the design pattern data that serves as the figure data is input to the reference image generation circuit 112, the design pattern data is expanded into data for each figure, and the figure code, the figure dimension, and the like indicating the figure shape of the figure data are analyzed. Then, this is expanded into binary or multi-valued design pattern image data as a pattern arranged in a square having a grid with a predetermined quantization dimension as a unit, and is output. In other words, the design data is read, the occupancy rate of the figure in the design pattern is calculated for each square created by virtually dividing the inspection region into squares each having a predetermined dimension as a unit, and n-bit occupancy rate data is output. For example, it is preferable to set one square as one pixel. Then, assuming that one pixel has a resolution of $1/2^8$ (=1/256), a small region of 1/256 is allocated to the region of the figure arranged in the pixel and the occupancy rate in the pixel is calculated. Then, 8-bit occupancy rate data is obtained. Such a square (inspection pixel) may be matched with each pixel of the measurement data.

Then, the reference image generation circuit 112 performs filtering processing on the design image data of the design pattern, which is the image data of the figure, by using a predetermined filter function. In this manner, the design image data whose image intensity (shade value) is image data on the design side of the digital value can be matched with image generation characteristics obtained by emission of the multiple primary electron beams 20. The image data for each pixel of the generated reference image is output to the comparison circuit 108.

The comparison circuit 108 aligns the frame image 31 (first image) serving as an image to be inspected and the reference image (second image) corresponding to the frame image in units of sub-pixels for each frame region 30. For example, the alignment may be performed by the method of least squares.

Then, the comparison circuit 108 compares the frame image 31 (first image) with the reference image (second image). The comparison circuit 108 compares the frame image 31 (first image) with the reference image (second image) for each pixel 36 according to a predetermined determination condition. For example, the comparison circuit 108 determines whether or not there is a defect, such as a shape defect. For example, if the gradation value difference for each pixel 36 is larger than a determination threshold value Th, it is determined that there is a defect. Then, the comparison result is output. The comparison result may be output to the storage device 109, the monitor 117, or the memory 118, or may be output from the printer 119.

In addition to the die to database inspection described above, it is also preferable to perform a die to die inspection in which pieces of measurement image data obtained by imaging the same pattern at different locations on the same substrate are compared with each other. Alternatively, the inspection may be performed using only the self-measured image.

Figure 14:
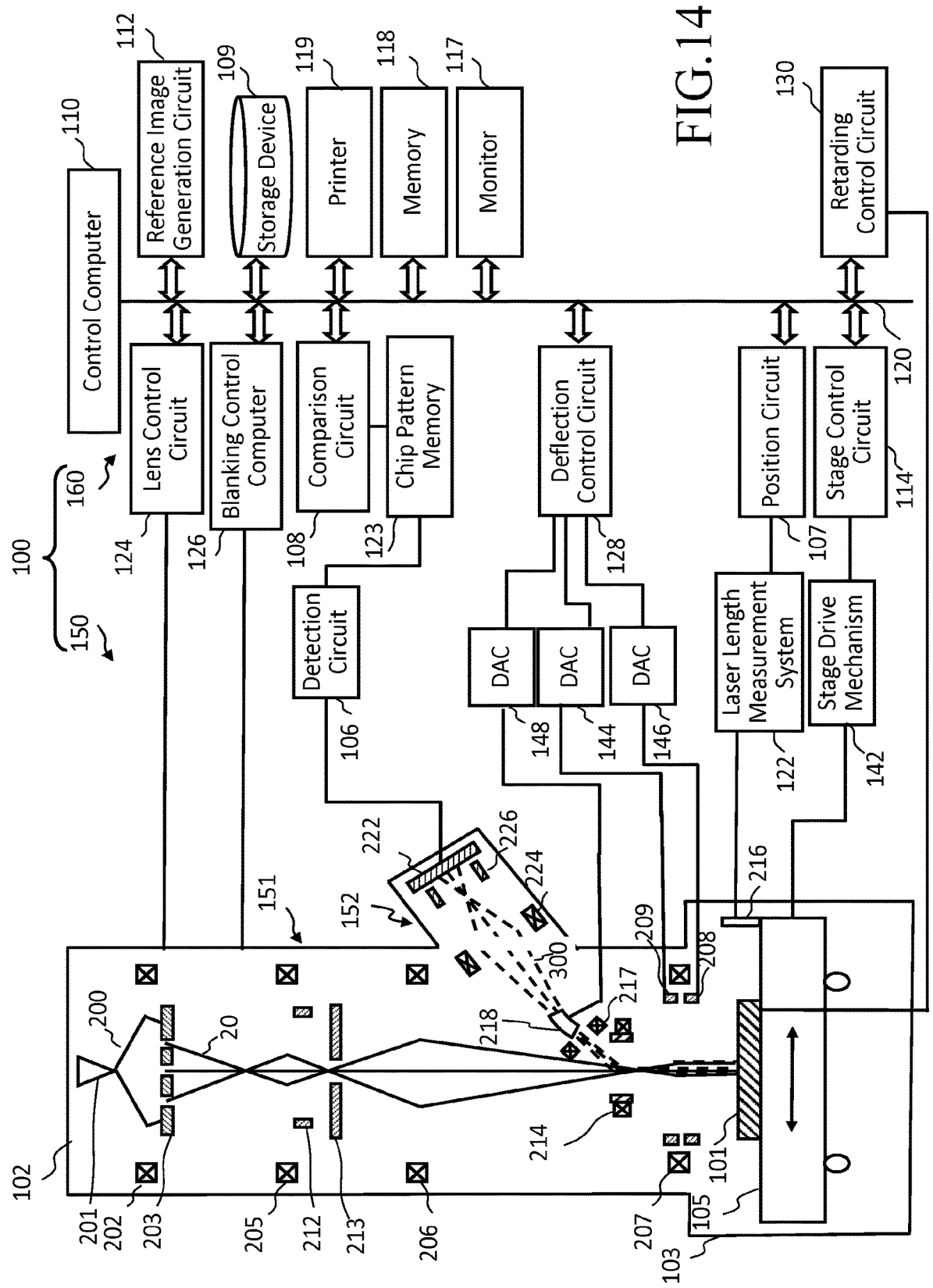
FIG. 14 is a configuration diagram showing the configuration of a pattern inspection apparatus according to a modification example of Embodiment 1.

FIG. 14 is a configuration diagram showing the configuration of a pattern inspection apparatus according to a modification example of Embodiment 1. FIG. 14 is the same as FIG. 1 except that the electromagnetic lens 217 is arranged between the beam separator 214 and the deflector 218 with respect to the secondary electron trajectory.

Figure 15:
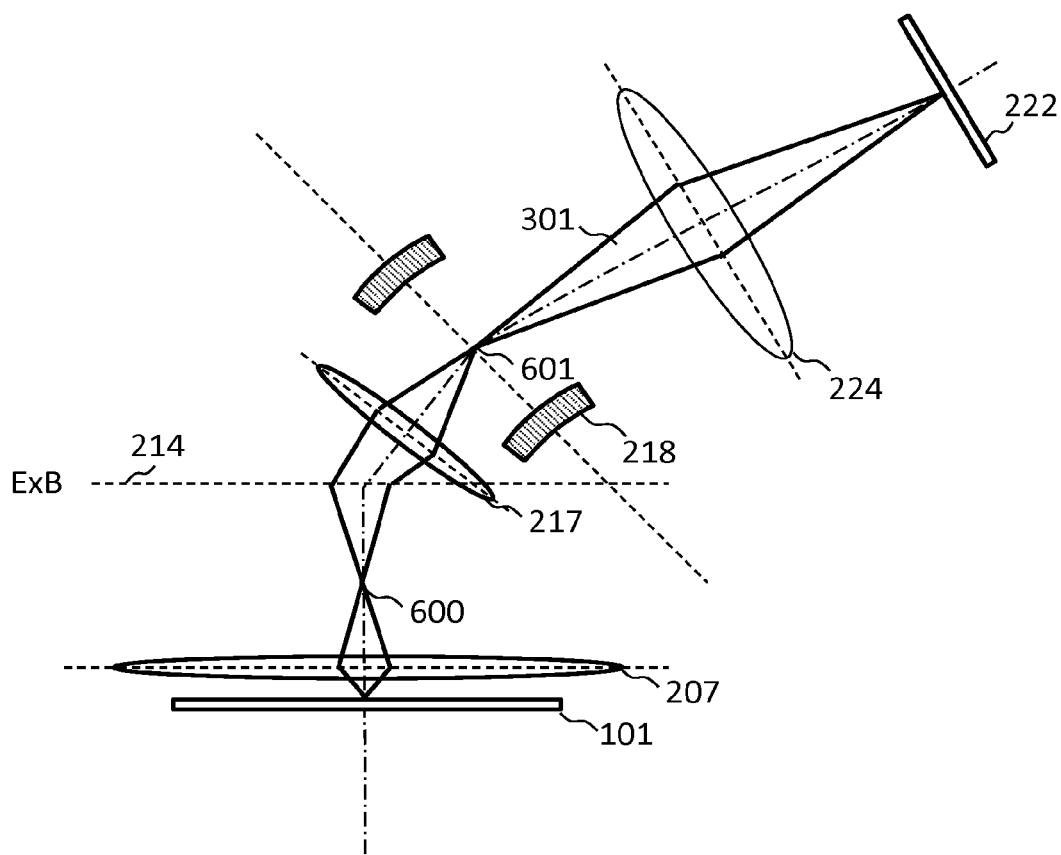
FIG. 15 is a diagram showing an example of the trajectory of multiple secondary electron beams in the modification example of Embodiment 1.

FIG. 15 is a diagram showing an example of the trajectory of multiple secondary electron beams in the modification example of Embodiment 1. In FIG. 15, the multiple secondary electron beams 300 whose trajectory is bent in the focusing direction by the electromagnetic lens 207 (objective lens) to form the intermediate image plane 600 (imaging point) travel to the beam separator 214 while spreading. Then, the multiple secondary electron beams 300 are separated from the multiple primary electron beams 20 by the beam separator 214, and travel to the electromagnetic lens 217 while spreading. Then, the trajectory of the multiple secondary electron beams in the divergence direction is bent in the focusing direction by the electromagnetic lens 217. At that time, the electromagnetic lens 217 forms the intermediate image plane 601 (imaging point) at the deflection point of the deflector 218 with the multiple secondary electron beams. In this manner, as shown in FIG. 15, the beam diameter of each secondary electron beam can be reduced at the position of the deflection point in the deflector 218. In the example of FIG. 15, the trajectory of the central secondary electron beam 301 of the multiple secondary electron beams 300 is shown. Thus, it is possible to suppress the aberration occurring in the deflector 218. Therefore, the beam diameter can be reduced on the detection surface of the multi-detector 222 by the lens work of the electromagnetic lens 224 after the secondary electron beams pass through the deflector 218, and an image can be formed on the detection surface of the multi-detector 222 in a state in which the secondary electron beams are separated. As a result, it is possible to detect the secondary electron beams individually. Therefore, the deflection point of the deflector 218 is conjugated to the surface of the substrate 101 and the detection surface of the multi-detector 222.

As described above, according to Embodiment 1, it is possible to reduce the aberration occurring in the detection optical system and separate each secondary electron beam of the multiple secondary electron beams on the detection surface. Therefore, it is possible to reduce the pitch between beams.

In the above description, the series of "~circuits" include a processing circuit, and the processing circuit includes an electric circuit, a computer, a processor, a circuit board, a quantum circuit, a semiconductor device, and the like. In addition, a common processing circuit (same processing circuit) may be used for the respective "~circuits". Alternatively, different processing circuits (separate processing circuits) may be used. A program for executing the processor and the like may be recorded on a record carrier body, such as a magnetic disk drive, a magnetic tape device, an FD, or a ROM (read only memory). For example, the position circuit 107, the comparison circuit 108, the reference image generation circuit 112, and the like may be configured by at least one processing circuit described above.

The embodiment has been described above with reference to specific examples. However, the invention is not limited to these specific examples. For example, the electromagnetic lens 217 may be an electrostatic lens.

In addition, the description of parts that are not directly required for the description of the invention, such as the apparatus configuration or the control method, is omitted. However, the required apparatus configuration, control method, and the like can be appropriately selected and used.

In addition, all multi-electron beam image acquisition apparatuses and multi-electron beam image acquisition methods that include the elements of the invention and can be appropriately redesigned by those skilled in the art are included in the scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-beam image acquisition apparatus, comprising:
a stage on which a substrate is placed;
an objective lens configured to image multiple primary electron beams on the substrate by using the multiple primary electron beams;
a separator configured to have two or more electrodes for forming an electric field and two or more magnetic poles for forming a magnetic field and configured to separate multiple secondary electron beams emitted due to the substrate being irradiated with the multiple primary electron beams from trajectories of the multiple primary electron beams by the electric field and the magnetic field formed;
a deflector configured to deflect the multiple secondary electron beams separated;
a lens arranged between the objective lens and the deflector and configured to image the multiple secondary electron beams at a deflection point of the deflector; and
a detector configured to detect the deflected multiple secondary electron beams.

2. The apparatus according to claim 1,
wherein the deflection point of the deflector is conjugated to a surface of the substrate and a detection surface of the detector.

3. The apparatus according to claim 1,
wherein the lens is arranged between the objective lens and the separator.

4. The apparatus according to claim 1,
wherein the lens is arranged between the separator and the deflector.

5. The apparatus according to claim 1,
wherein the deflector deflects the multiple secondary electron beams with a central axis trajectory of the multiple secondary electron beams separated by the separator being directed toward the detector, and
the lens images the multiple secondary electron beams separated by the separator at the deflection point of the deflector.

6. The apparatus according to claim 5,
wherein the lens further refracts the multiple primary electron beams.

7. The apparatus according to claim 6,
wherein the multiple primary electron beams refracted by the lens are incident on the objective lens while spreading.

8. A multi-beam image acquisition method, comprising:
imaging multiple primary electron beams on a substrate placed on a stage by using an objective lens;
separating multiple secondary electron beams emitted due to the substrate being irradiated with the multiple primary electron beams from trajectories of the multiple primary electron beams by an electric field and a magnetic field formed by using a separator having two or more electrodes for forming an electric field and two or more magnetic poles for forming a magnetic field;
deflecting a separated multiple secondary electron beams by using a deflector;
imaging the multiple secondary electron beams at a deflection point of the deflector by using a lens arranged between the objective lens and the deflector; and
detecting a deflected multiple secondary electron beams by using a detector and outputting data of a secondary electron image based on a signal of the detected multiple secondary electron beams.

9. The method according to claim 8,
wherein the deflection point of the deflector is conjugated to a surface of the substrate and a detection surface of the detector.

10. The method according to claim 9,
wherein the multiple secondary electron beams are imaged at the deflection point of the deflector as a result of refraction by the lens before being separated from the trajectories of the multiple primary electron beams.

* * * * *